(12) United States Patent
Gizdarski et al.

(10) Patent No.: US 12,015,411 B2
(45) Date of Patent: Jun. 18, 2024

(54) TESTABLE TIME-TO-DIGITAL CONVERTER

(71) Applicant: Synopsys, Inc., Mountain View, CA (US)

(72) Inventors: Emil Gizdarski, Cupertino, CA (US); Anubhav Sinha, Hyderabad (IN)

(73) Assignee: Synopsys, Inc., Sunnyvale, CA (US)

( * ) Notice: Subject to any disclaimer, the term of this patent is extended or adjusted under 35 U.S.C. 154(b) by 262 days.

(21) Appl. No.: 17/752,774

(22) Filed: May 24, 2022

(65) Prior Publication Data
US 2022/0385280 A1 Dec. 1, 2022

(30) Foreign Application Priority Data
May 25, 2021 (IN) .............................. 202141023266

(51) Int. Cl.
*H03K 5/131* (2014.01)
*G04F 10/00* (2006.01)
*H03K 5/00* (2006.01)

(52) U.S. Cl.
CPC ........... *H03K 5/131* (2013.01); *G04F 10/005* (2013.01); *H03K 2005/00058* (2013.01)

(58) Field of Classification Search
CPC ...... H03K 5/131; H03K 17/28; H03K 17/292; G04F 10/005
See application file for complete search history.

(56) References Cited

U.S. PATENT DOCUMENTS

| | | | |
|---|---|---|---|
| 5,204,559 A | | 4/1993 | Deyhimy et al. |
| 8,717,084 B1 | * | 5/2014 | Hold ................. H03K 5/133 327/393 |
| 2009/0141770 A1 | | 6/2009 | Chen et al. |

OTHER PUBLICATIONS

International Application No. PCT/US/2022/030793, Partial Search dated Sep. 19, 2022.
International Report on Patentability, International Application No. PCT/US2022/030793, dated Dec. 7, 2023, consists of 12 pages.
International Search Report and Written Opinion, International Application No. PCT/US2022/030793, dated Nov. 11, 2022, consists of 16 pages.
D. Fick et al., "In situ delay-slack monitor for high-performance processors using an all-digital self-calibrating 5ps resolution time-to-digital converter," 2010 Inter. Solid-State Circuits Conf.
Alan Drake et al., "A Distributed Critical-Path Timing Monitor for a 65nm High-Performance Microprocessor" 2007 Inter. Solid-State Circuits Conf.
Keith Bowman et al. "All-Digital Circuit-Level Dynamic Variation Monitor for Silicon Debug and Adaptive Clock Control", IEEE Tran. on Cir. and Sys., Sep. 2011.

(Continued)

*Primary Examiner* — Joseph J Lauture
(74) *Attorney, Agent, or Firm* — Patterson + Sheridan, LLP

(57) ABSTRACT

A delay selector includes a first multiplexer, a first inverter, a second multiplexer, and a second inverter. The first multiplexer has a first input coupled to an input of the delay selector. The first inverter is coupled between the input of the delay selector and a second input of the first multiplexer. The second multiplexer has a first input coupled to an output of the first multiplexer. The second inverter is coupled between the output of the first multiplexer and a second input of the second multiplexer.

20 Claims, 12 Drawing Sheets

(56) References Cited

OTHER PUBLICATIONS

Youhua Shi et al., "In-situ Timing Monitoring Methods for Variation-Resilient Designs" 2014 IEEE Asia Pacific Conf, C&S.
Liangzhen Lait et al., "SlackProbe: A Low Overhead In Situ On-line Timing Slack Monitoring Methodology", 2013 Date.
Ghazanfar Ali, et al. "IJTAG Compatible Delay-line based Voltage Embedded Instrument with One Clock-cycle Conversion Time", 2019 Latin American Test Symposium.
Alan J. Drake et al., "Single-Cycle, Pulse-Shaped Critical Path Monitor in the Power7+ Microprocessor" 2013 IEEE, Symposium on Low Power Electronics and Design, 6 pages.
Keith A. Bowman "Adapative Resilient Circuits", IEEE Solid-State Circuits Magazine, Date of publication: Aug. 13, 2018 (Downloaded on Dec. 21, 2020 at 23:16:01 UTC from IEEE Xplore).
Keith A. Bowman, et al. "Energy-Efficient and Metastability-Immune Resilient Circuits for Dynamic Variation Tolerance", IEEE Journal of Solid-State Circuits, vol. 44, No. 1, Jan. 2009.
Keith A. Bowman, et al. "Adapative Resilient Circuits for Dynamic Variation Tolerance", 2013 IEEE, Downloaded on Dec. 21, 2020 at 23:19:27 UTC from IEEE Xplore.

\* cited by examiner

TESTABLE TIME-TO-DIGITAL CONVERTER

RELATED APPLICATION

This application claims priority to and the benefit of India Patent Application Serial No. 202141023266, entitled "Testable Hybrid Time-To-Digital Converter," filed May 25, 2021, which is incorporated herein by reference in its entirety.

TECHNICAL FIELD

The present disclosure generally relates to a delay selector. In particular, the present disclosure relates to a delay selector for a time-to-digital converter.

BACKGROUND

Safety-critical applications monitor for performance degradation and aging of integrated circuits (IC). Accordingly, various sensors for voltage, temperature, and path monitoring are built into the ICs. Data from these sensors are collected during manufacturing tests and in-system tests to support efficient silicone bring-up, volume production, and in-field testing. In particular, path monitoring (PM) units may be used to measure a degradation of propagation delay for selected paths in the IC.

SUMMARY

Embodiments described herein include testable time-to-digital converters (TDCs) and delay selectors within the TDCs. According to an embodiment, a delay selector includes a first multiplexer, a first inverter, a second multiplexer, and a second inverter. The first multiplexer has a first input coupled to an input of the delay selector. The first inverter is coupled between the input of the delay selector and a second input of the first multiplexer. The second multiplexer has a first input coupled to an output of the first multiplexer. The second inverter is coupled between the output of the first multiplexer and a second input of the second multiplexer.

The delay selector may include a buffer coupled between the output of the first multiplexer and the second input of the second multiplexer in series with the second inverter.

The delay selector may include a third multiplexer, a third inverter, and one or more buffers. The third multiplexer has a first input coupled to an output of the second multiplexer. The third inverter is coupled between the output of the second multiplexer and a second input of the third multiplexer. The one or more buffers are coupled between the output of the second multiplexer and the second input of the third multiplexer in series with the third inverter. More buffers may be coupled in series with the third inverter between the output of the second multiplexer and the second input of the third multiplexer than in series with the second inverter between the output of the first multiplexer and the second input of the second multiplexer.

The delay selector may include a buffer coupled between an output of the second multiplexer and a first output of the delay selector. The output of the second multiplexer may be coupled to a second output of the delay selector.

According to another embodiment, a time-to-digital converter (TDC) includes a delay selector and a first flip flop. The delay selector includes a first multiplexer having a first input coupled to an input of the delay selector, a first inverter coupled between the input of the delay selector and a second input of the first multiplexer, a second multiplexer having a first input coupled to an output of the first multiplexer, and a second inverter coupled between the output of the first multiplexer and a second input of the second multiplexer. The first flip flop has an input coupled to an output of the delay selector.

The TDC may include a second flip flop and a buffer coupled between the output of the second multiplexer and an input of the second flip flop.

The TDC may include a third multiplexer having a first input coupled to an output of the second multiplexer, a third inverter coupled between the output of the second multiplexer and a second input of the third multiplexer, and one or more buffers coupled between the output of the second multiplexer and the second input of the third multiplexer in series with the third inverter. More buffers may be coupled in series with the third inverter between the output of the second multiplexer and the second input of the third multiplexer than in series with the second inverter between the output of the first multiplexer and the second input of the second multiplexer. The TDC may include a register arranged to provide control signals to the first multiplexer and the second multiplexer. The control signals may adjust a delay provided by the delay selector.

According to an embodiment, a TDC includes a delay selector that includes a first multiplexer having a first input coupled to an input of the delay selector, a first inverter coupled between the input of the delay selector and a second input of the first multiplexer, a second multiplexer having a first input coupled to an output of the first multiplexer, and a second inverter coupled between the output of the first multiplexer and a second input of the second multiplexer. The TDC includes a third multiplexer arranged to receive an output of the delay selector at a first input of the third multiplexer and a first flip flop coupled to an output of the third multiplexer.

The TDC may include a third inverter coupled between the output of the delay selector and a second input of the third multiplexer and a buffer coupled between the output of the delay selector and the first input of the third multiplexer.

A second input of the third multiplexer may be an inverting input and may be coupled to the output of the delay selector. The second input of the first multiplexer may be an inverting input that includes the first inverter. The second input of the second multiplexer may be an inverting input that includes the second inverter.

The TDC may include a register arranged to provide control signals to the first multiplexer and the second multiplexer. The control signals may adjust a delay provided by the delay selector. The TDC may include logic arranged to produce, to the third multiplexer, a control signal based on the control signals provided by the register. The control signal produced by the logic may be an exclusive or of the control signals provided by the register. The register may be arranged to produce a control signal to the third multiplexer.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to testable time-to-digital converters. As discussed above, path monitoring (PM) units may be used to measure a degradation of propagation delay for selected paths in an integrated circuit (IC). PM units include a time-to-digital converter (TDC) having a delay selector for monitoring degradation of propagation delay. Accordingly, the TDCs estimate the degradation for propagation signals by adding extra delay to input signals until an incorrect output value is produced. The delay selector may present certain challenges. For example, the delay selector of a serial TDC may be untestable. As a result, measurements of the degradation of propagation delay may be incorrect or misleading. A parallel TDC may address some of these issues, but a parallel TDC has a larger hardware overhead than the serial TDC.

The present disclosure describes various designs of TDCs that use 2-input multiplexers (MUXs), which allows testing of certain faults of the delay selector. Other aspects include an implementation of a hybrid TDC that may combine a serial TDC implementation with a parallel TDC implementation, as described in more detail herein. Generally, the TDC designs use inverters and 2-input MUXs to perform the functions of existing TDCs that use larger MUXs. Each of the 2-input MUXs may be controlled by a single control bit or signal, and changes to the control signal change the delay provided by the TDC. Additionally, the inverters also cause the MUXs to output different signals when the control signal changes.

These designs may provide one or more technical advantages. For example, the TDCs may output different values when one or more of the control signals to the TDCs change. As a result, it is easier to test the TDCs by examining the outputs of the TDCs. Additionally, because changing one or more of the control signals to the TDCs also changes the selected propagation delays, degradations in the propagation delays may be more easily tested relative to existing designs. As another example, the TDCs may maintain a lower hardware overhead relative to existing parallel TDC designs.

Figure 1:
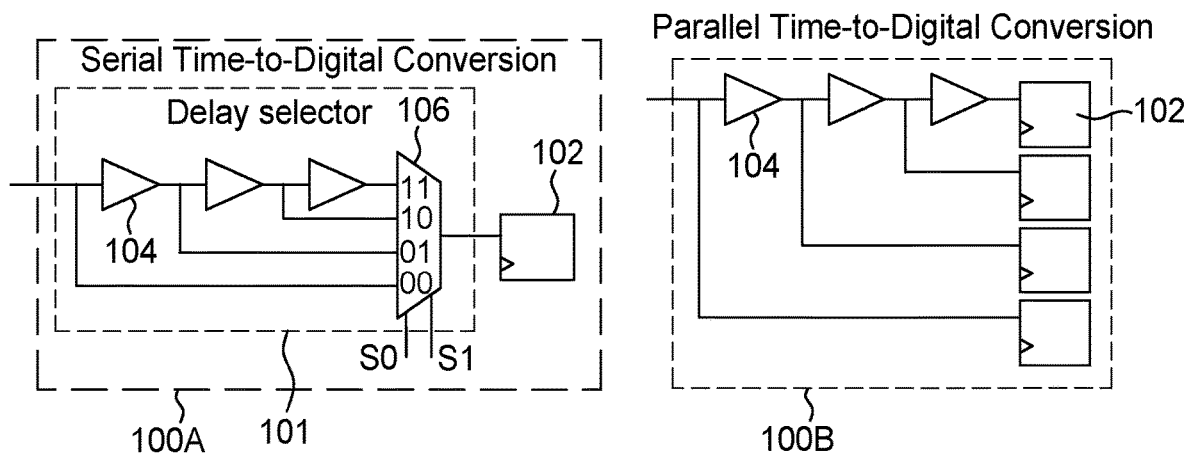
FIG. 1 shows diagrams of serial and parallel time-to-digital converters (TDCs).

FIG. 1 shows diagrams of a serial TDC 100A and a parallel TDC 100B. The serial TDC 100A performs one measurement at a time and includes an n:1 delay selector 101 (n being a positive integer) and a single capture flip-flop 102. The n:1 delay selector 101 includes a series of n-1 buffers (e.g., buffer 104) that are selectively included and excluded from a path under test by a multiplexer 106. In this way, the degradation of propagation delay of selected paths under test can be determined. In addition, the serial TDC 100A may include an embedded log 2n-bit register (or counter) that is not shown in FIG. 1, where the value of the register determines the number delay elements (or buffers) added by the delay selector. On the other hand, the parallel TDC 100B performs n measurements in parallel and includes a series of n-1 buffers (e.g., buffer 104) and n capture flip-flops (e.g., flip-flop 102).

Advantages of the serial TDC 100A include having a smaller hardware overhead than the parallel TDC 100B, in certain embodiments. One disadvantage of the serial TDC 100A is having to take multiple measurements in series and that the delay selector 101 is not testable, as described in more detail with respect to FIG. 3. The design considerations of PM units include: accuracy, hardware overhead, and test application time. Safety critical circuits may include hundreds of PM units, which puts an emphasis on hardware overhead.

Figure 2:
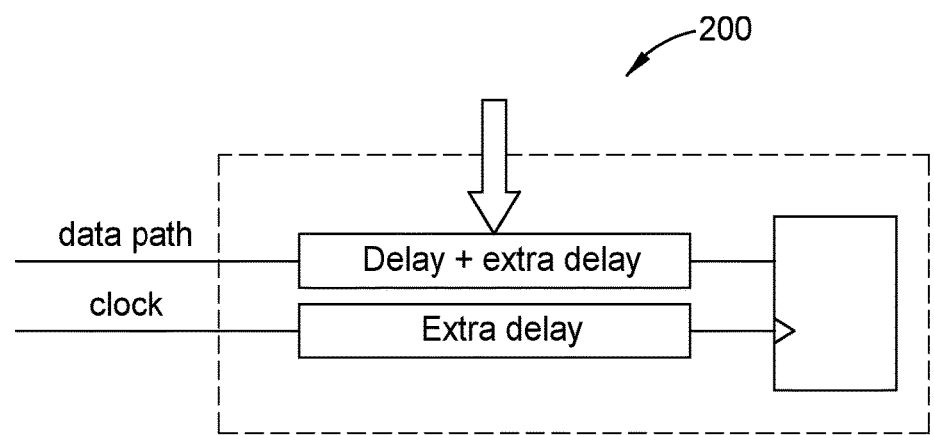
FIG. 2 shows a timing model of a path monitoring (PM) unit.

FIG. 2 shows a timing model 200 of a PM unit. Data and clock paths include a configurable delay and an extra delay, where the configurable delay is equal to the propagation delay of a series of buffers and the extra delay is equal to the propagation delay of path selector multiplexer (MUX) gates and delay selector MUX gates. In the current context, variations in propagation delay of MUX gates has an impact on accuracy, and the accuracy of PM units is disproportional to the number of 2-input MUX gates in the data path.

Figure 3:
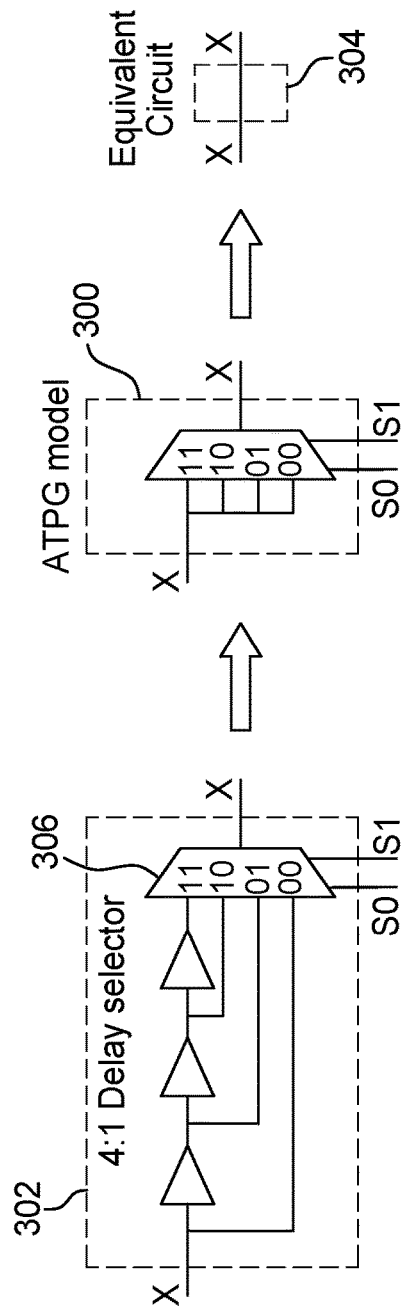
FIG. 3 shows an automatic test pattern generation (ATPG) model of a delay selector.

FIG. 3 shows an automatic test pattern generation (ATPG) model 300 of a 4:1 delay selector 302 used to show a deficiency of serial TDCs. This example shows an ATPG model 300 and an equivalent circuit 304 of the 4:1 delay selector 302 based on a zero delay model. Accordingly, values of the select signals S0 and S1 of the 4:1 delay selector 302 do not change its logic behavior. As the ATPG model 300 does not take into account delay, the ATPG model 300 of the delay selector 302 becomes untestable. That is, regardless of the select signal to the multiplexer (MUX) 306, the same output may be produced. These defects in the select signals are untestable, and if they exist, then measurements are inaccurate or corrupted.

Figure 4:
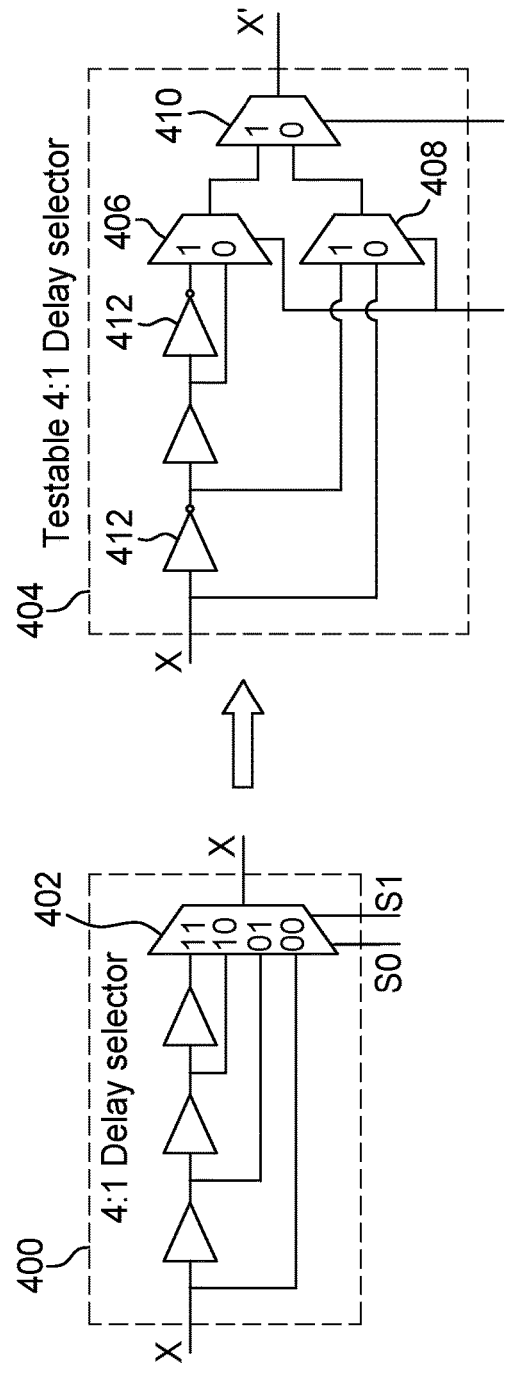
FIG. 4 shows an example implementation dependent approach to construct a testable delay selector.

FIG. 4 shows an example implementation dependent approach to construct a testable n:1 delay selector where typical values of parameter n is an integer between 8 and 32. As shown, an n-input MUX may be constructed as at least n-1 2-input MUXs. Specifically, a 4:1 delay selector 400 that uses a 4-input MUX 402 may be constructed instead as a testable 4:1 delay selector 404 using three 2-input MUXs 406, 408, and 410. The paths in the testable 4:1 delay selector 404 may include the same number of 2-input MUXs. Also, to ensure that the 4-input MUX 402 is testable, both inputs of each 2-input MUX 406, 408, and 410 may receive opposite values (e.g., values of different logic states) by using an inverter (e.g., inverter 412) as a delay element. This approach involves knowledge of an internal structure of an n-input MUX. Also, an n-input MUX includes path adjustments when n is not a power of two. In other words, by using an inverter as a delay element between inputs of a MUX, the output of the MUX will change logic states depending on the select signal used to control the MUX. Thus, the delay selector can be modeled and tested even using a zero delay model.

Figure 5:
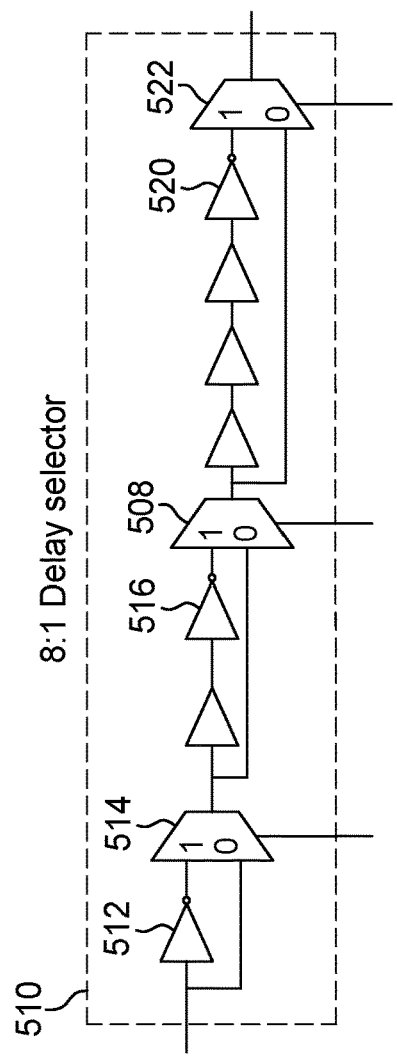
FIG. 5 shows an example implementation independent approach for construction of testable delay selectors.
Figure 5:
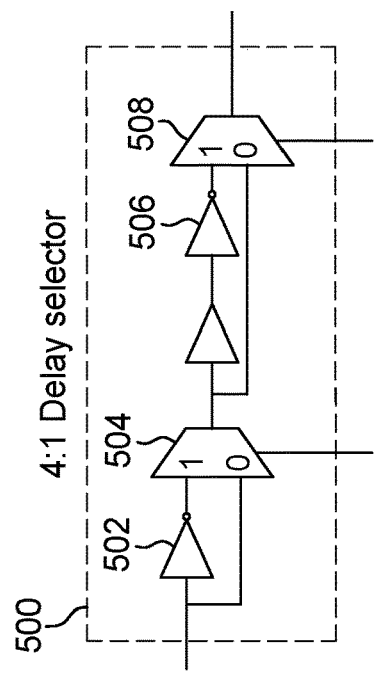

FIG. 5 shows an example implementation independent approach for construction of testable n:1 delay selectors when n is a power of two (e.g., n=4 and n=8). The implementation independent approach reduces the number of 2-input MUXs from n-1 to log 2n. Specifically, a 4:1 delay selector 500 includes an inverter 502 that inverts an input signal to the 4:1 delay selector 500. A 2-input MUX 504 receives the input signal and the inverted input signal from the inverter 502. The 4:1 delay selector 500 also includes an inverter 506 that inverts the output of the 2-input MUX 504. Another 2-input MUX 508 receives the output of the 2-input MUX 504 and the inverted output of the 2-input MUX 504 from the inverter 506. The inverters 502 and 506 also serve as delay elements in the 4:1 delay selector 500. Additionally a buffer may be connected in series with the inverter 506 to introduce additional delay. As seen in the examples of FIG. 4 and FIG. 5, the 4:1 delay selector 500 reduces the number of 2-input MUXs from three to two (or 1.5× reduction).

Additionally, an 8:1 delay selector 510 includes an inverter 512 that inverts an input signal to the 8:1 delay selector 510. A 2-input MUX 510 receives the input signal and the inverted input signal from the inverter 512. The 8:1 delay selector 510 also includes an inverter 516 that inverts the output of the 2-input MUX 514. A buffer may be connected in series with the inverter 516 to introduce additional delay. Another 2-input MUX 518 receives the output of the 2-input MUX 514 and the inverted output of the 2-input MUX 514 from the inverter 516. Another inverter 520 inverts the output of the 2-input MUX 518. Multiple buffers may be connected in series with the inverter 520 to introduce additional delay. Another 2-input MUX 522 receives the output of the 2-input MUX 518 and the inverted output of the 2-input MUX 518 from the inverter 520. The inverters 512, 516, and 518 also serve as delay elements in the 8:1 delay selector 510. As a result, the 8:1 delay selector 510 uses three 2-input MUXs as opposed to seven 2-input MUXs (or 2.33× reduction).

For n=16 and n=32, the reduction of the number of 2-input MUXs is 3.75× and 6.2×, respectively. As shown, one of the inputs of each of the MUXs is driven by an inverter such that the output of each MUX flips logic states depending on the select signal to the MUX.

Figure 6:
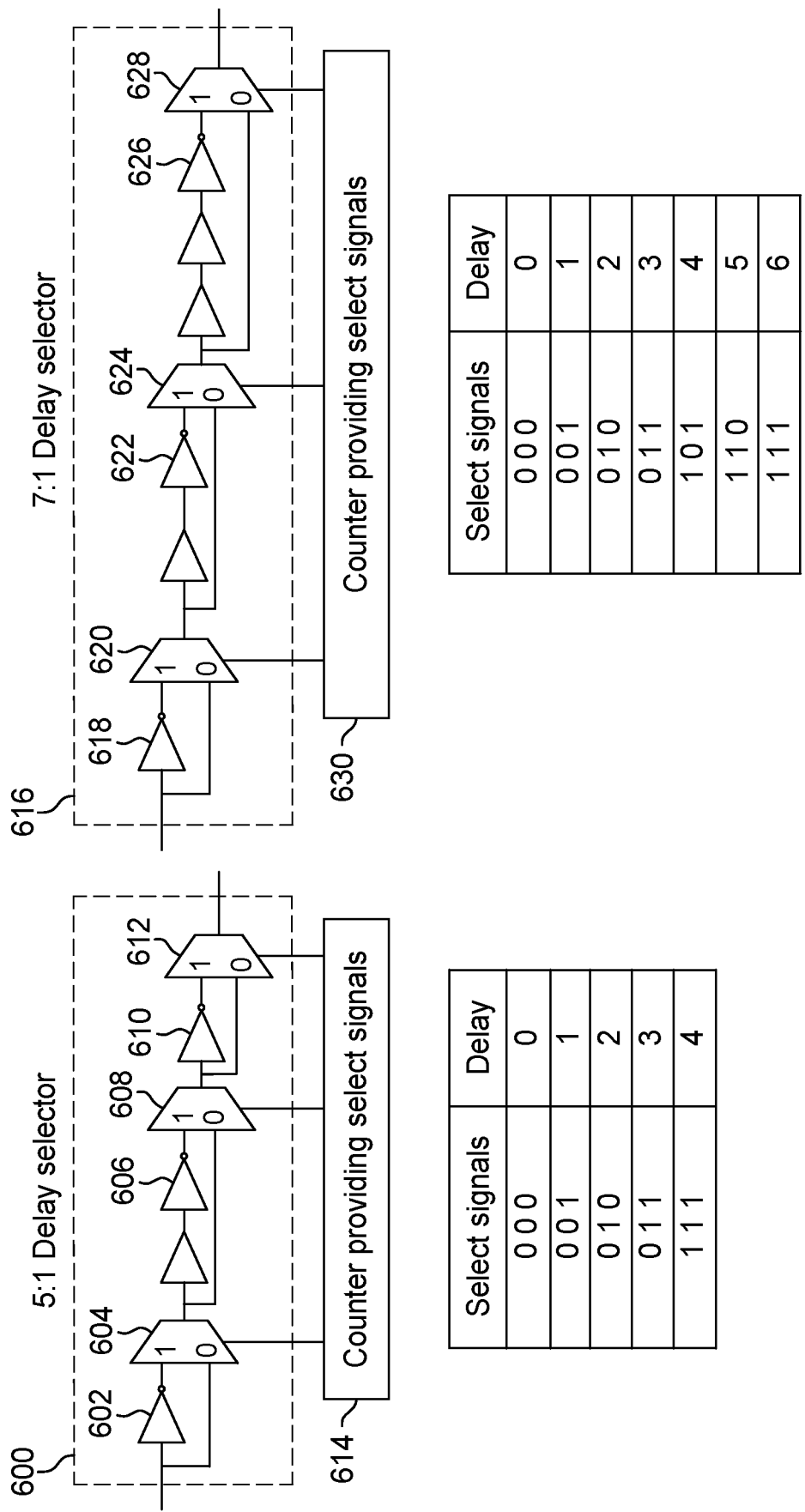
FIG. 6 shows an example implementation independent approach for construction of testable delay selectors.

FIG. 6 shows an example implementation independent approach for construction of testable n:1 delay selectors when n is not a power of two (e.g., n=5 and n=7). Specifically, a 5:1 delay selector 600 includes an inverter 602 that inverts an input signal to the 5:1 delay selector 600. A 2-input MUX 604 receives the input signal and the inverted input signal from the inverter 602. Another inverter 606 inverts the output of the 2-input MUX 604. A buffer may be connected in series with the inverter 606 to introduce additional delay. Another 2-input MUX 608 receives the output of the 2-input MUX 604 and the inverted output of the 2-input MUX 604 from the inverter 606. Another inverter 610 inverts the output of the 2-input MUX 608. Another 2-input MUX 612 receives the output of the 2-input MUX 608 and the inverted output of the 2-input MUX 608 from the inverter 610. A register 614 provides select signals to the 2-input MUXs 604, 608, and 612.

A 7:1 delay selector 616 includes an inverter 618 that inverts an input signal to the 7:1 delay selector 616. A 2-input MUX 620 receives the input signal and the inverted input signal from the inverter 618. Another inverter 622 inverts the output of the 2-input MUX 620. A buffer may be connected in series with the inverter 622 to introduce additional delay. Another 2-input MUX 624 receives the output of the 2-input MUX 620 and the inverted output of the 2-input MUX 620 from the inverter 622. Another inverter 626 inverts the output of the 2-input MUX 624. Multiple buffers may be connected in series with the inverter 626 to introduce additional delay. Another 2-input MUX 628 receives the output of the 2-input MUX 624 and the inverted output of the 2-input MUX 624 from the inverter 626. A register 630 provides select signals to the 2-input MUXs 620, 624, and 628.

The tables below the delay selectors 600 and 616 show values of corresponding select signals used to control MUXs of the corresponding delay selector 600 or 616 and the corresponding delay. For example, if the select signal to the MUXs of the 5:1 delay selector 600 is 011, the MUX 604 receives logic low (0), the MUX 608 receives logic high (1), and the MUX 612 receives logic high (1). The corresponding delay may be three times the delay of each delay element. As seen in FIG. 6, the register 614 may provide control signals that produce five different levels of delay from the 5:1 delay selector 600. As another example, if the select signal to the MUXs of the 7:1 delay selector is 010, the MUX 620 receives logic low (0), the MUX 624 receives logic high (1), and the MUX 628 receives logic low (0). The corresponding delay may be two times the delay of each delay element. As seen in FIG. 6, the register 630 may provide control signals that produce seven different levels of delay from the 7:1 delay selector 616.

Some aspects are directed to TDC implementations that allow for multiple measurements at a time. Potential applications of a PM unit may support various scenarios including a case where select signals for a delay selector are generated by an embedded register.

Figure 7:
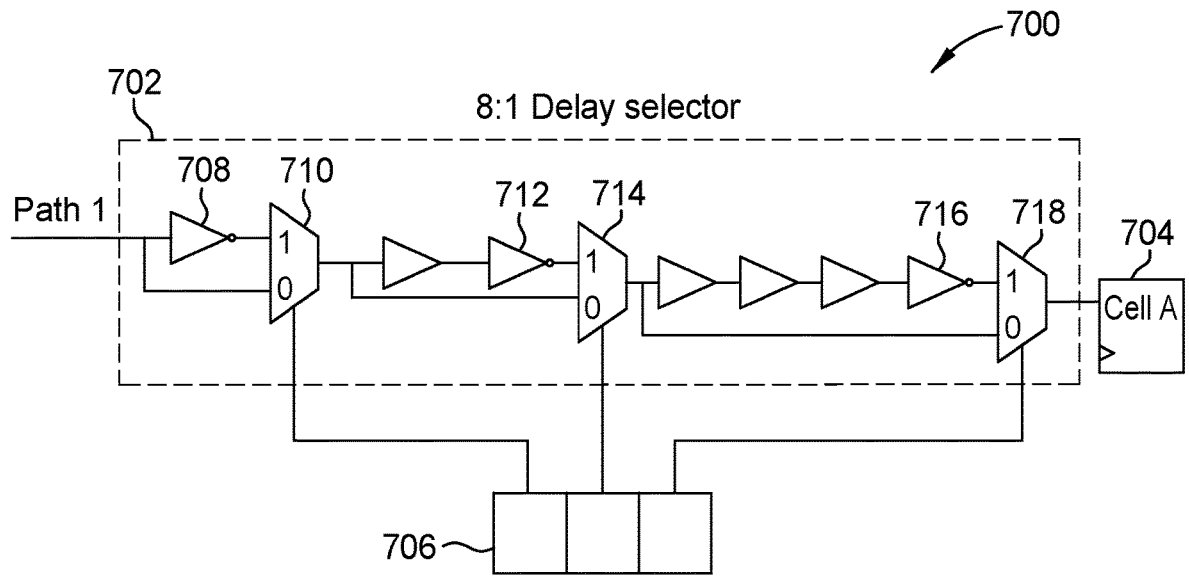
FIG. 7 shows an example of testable serial 8-bit TDC.

FIG. 7 shows an approach where a PM unit includes a serial 8-bit TDC 700 having an 8:1 delay selector 702, a capture flip-flop 704, and a 3-bit register 706. The 8:1 delay selector 702 includes an inverter 708 that inverts an input signal of the 8:1 delay selector 702. A 2-input MUX 710 receives the input signal and the inverted input signal from the inverter 708. An inverter 712 inverts the output of the 2-input MUX 710. A buffer may be connected in series with the inverter 712 to introduce additional delay. A 2-input MUX 714 receives the output of the 2-input MUX 710 and the inverted output of the 2-input MUX 710 from the inverter 712. An inverter 716 inverts the output of the 2-input MUX 714. Multiple buffers may be connected in series with the inverter 716 to introduce additional delay. A 2-input MUX 718 receives the output of the 2-input MUX 714 and the inverted output of the 2-input MUX 714 from the inverter 716. The capture flip-flop 704 receives the output of the 2-input MUX 718.

Figure 8:
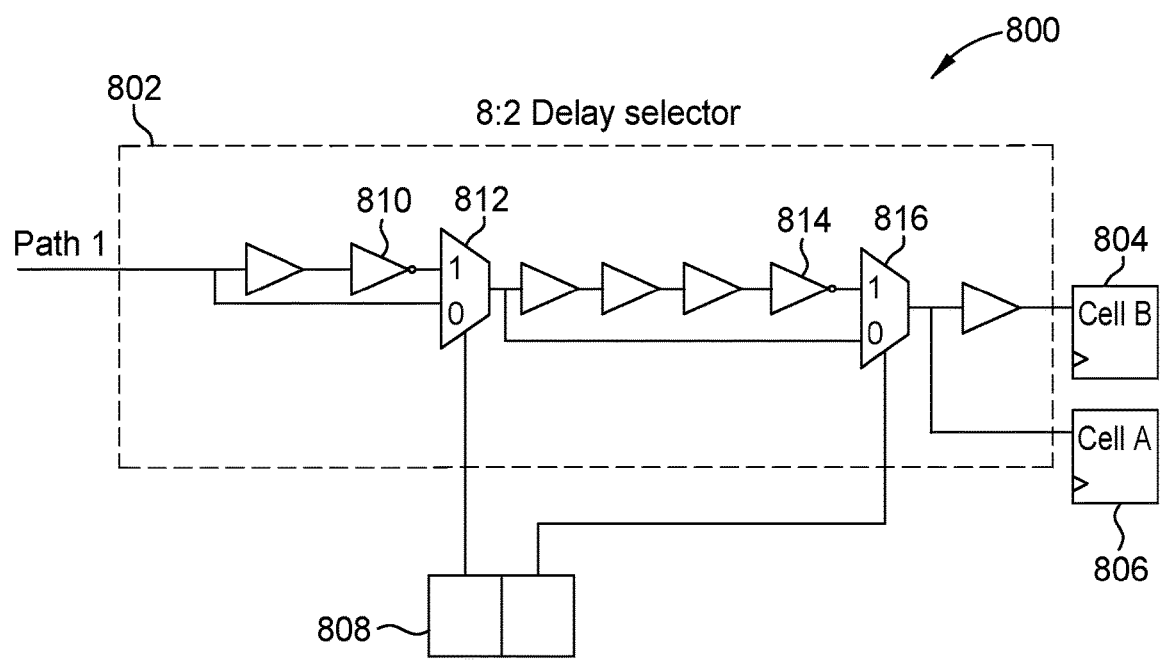
FIG. 8 shows an example of testable hybrid TDC.

FIG. 8 shows an aspect where the PM unit includes an 8-bit hybrid TDC 800 having an 8:2 delay selector 802, two capture flip-flops 804 and 806, and a 2-bit register 808. An inverter 810 inverts an input signal of the 8:2 delay selector 802. A buffer may be connected in series with the inverter 810 to introduce additional delay. A 2-input MUX 812 receives the input signal and the inverted input signal from the inverter 810. An inverter 814 inverts the output of the 2-input MUX 812. Multiple buffers may be connected in series with the inverter 814 to introduce additional delay. A 2-input MUX 816 receives the output of the 2-input MUX 812 and the inverted output of the 2-input MUX 812 from the inverter 814. The capture flip-flop 804 receives a delayed version of the output of the 2-input MUX 816 (e.g., through a buffer). The capture flip-flop 806 receives the output of the 2-input MUX 816.

Comparing the examples of FIGS. 7 and 8, a hardware overhead of the 8:2 delay selector 802 is reduced, relative to the 8:1 delay selector 702, by one 2-input MUX as well as one 2-input AND gate due to a reduction of the size of the register 808 from three bits to two bits. In addition, performing multiple measurements at a time (e.g., using the multiple flip-flops) effectively reduces test application time by reducing the number of patterns.

Figure 9:
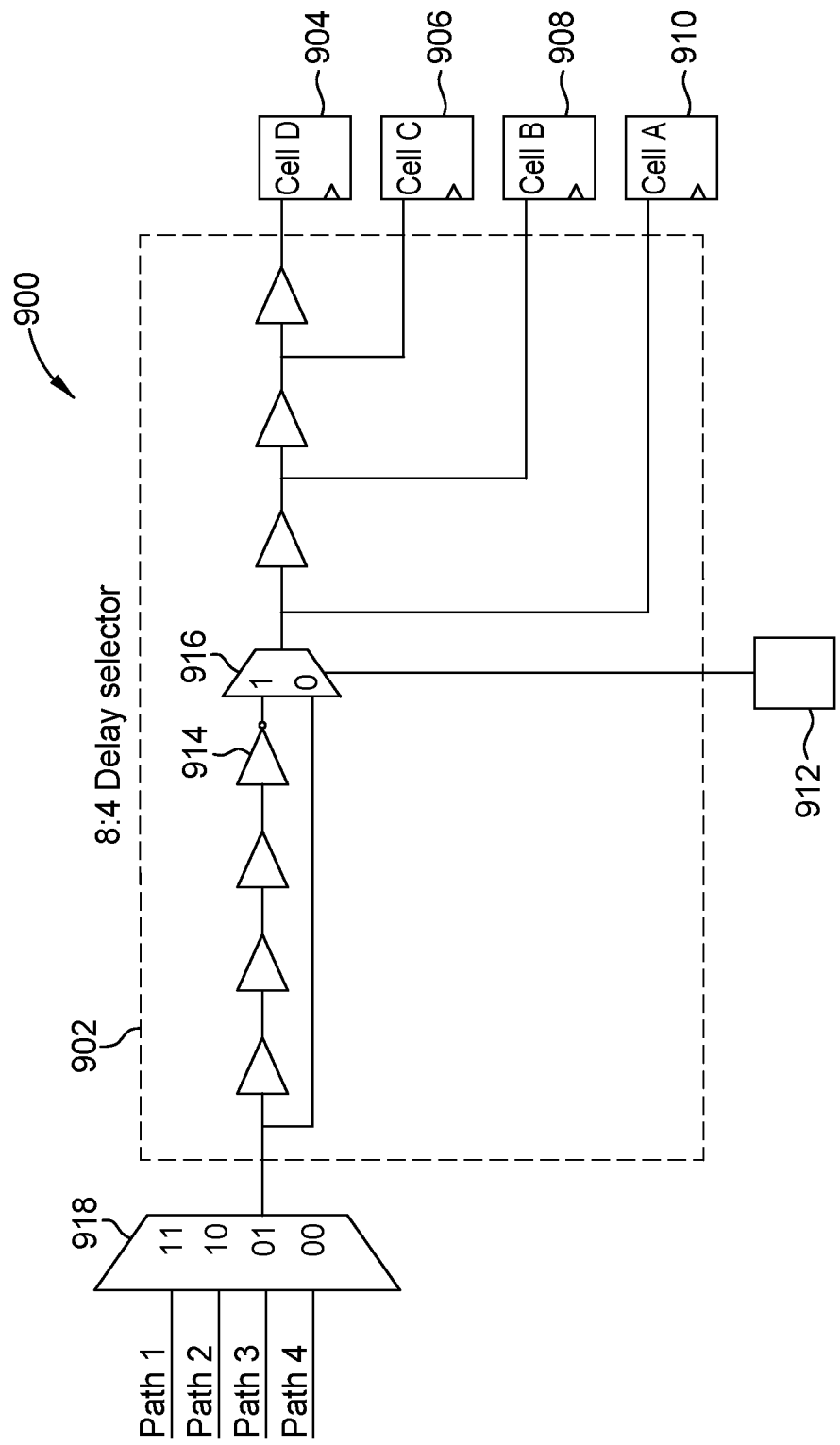
FIG. 9 shows an example of testable hybrid TDC.

FIG. 9 is an example 8-bit hybrid TDC 900 having an 8:4 delay selector 902, four capture flip-flops 904, 906, 908, and 910, and a 1-bit register 912. The 8:4 delay selector includes an inverter 914 inverts an input signal to the 8:4 delay selector 902. Multiple buffers are connected in series with the inverter 914 to introduce additional delay. A 2-input MUX 916 receives the input signal and the inverted input signal from the inverter 914. The capture flip-flop 910 receives the output of the 2-input MUX 916. The capture flip-flop 908 receives a delayed version of the output of the 2-input MUX 916 (e.g., through a buffer). The capture flip-flop 906 receives an even more delayed version of the output of the 2-input MUX 916 (e.g., through an additional buffer). The capture flip-flop 904 receives an even more delayed version of the output of the 2-input MUX 916 (e.g., through an additional buffer). The TDC 900 also includes a path selector MUX 918 that selects an input signal to the 8:4 delay selector 902.

Comparing the example of FIG. 9 with previous examples. The hardware overhead of the hybrid TDC 900 may be slightly higher than the serial TDC 700 shown in FIG. 7. Reducing two MUXs in the 8:4 delay selector 902 enables expanding of the path selector MUX 918 and adding more paths to the PM unit. This approach uses a proper path grouping and adjustment to make sure that potential path degradations of all selected paths fit into a path monitoring window. As a result, the TDC 900 effectively combines four PM units with 8-bit serial TDC performing a single measurement into one PM unit with an 8-bit hybrid TDC performing four measurements at a time. This approach, when applicable, supports a reduction in the hardware overhead of the PM unit. In summary, features are described for constructing testable delay selectors and performing multiple measurements at a time that improve accuracy and reduce hardware overhead of PM units while reducing test application time.

Figure 10A:
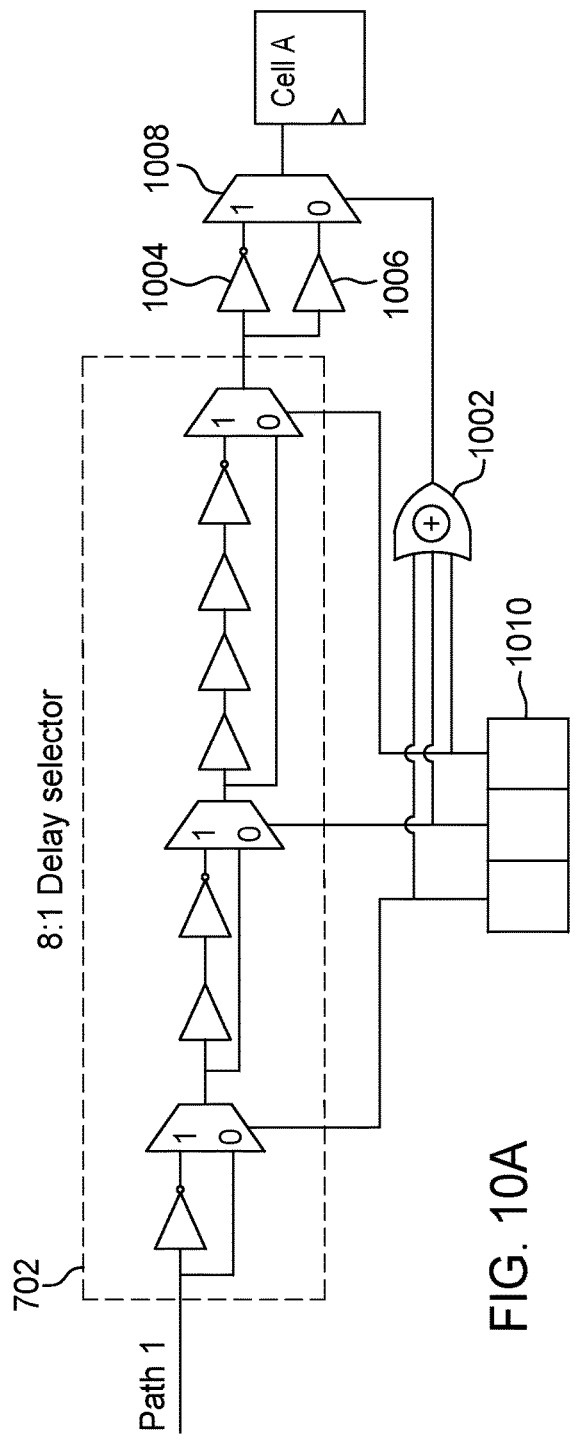
FIGS. 10A and 10B illustrate example techniques for eliminating effect of inversions within a testable delay selector.
Figure 10B:
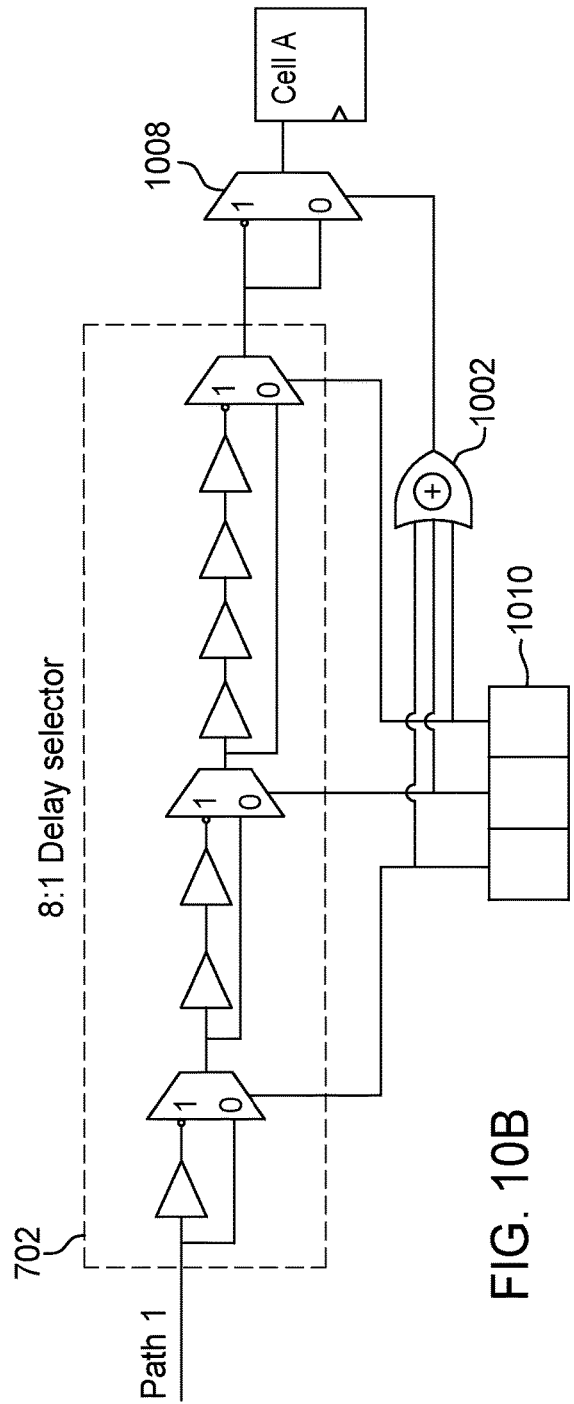

FIGS. 10A and 10B illustrate example techniques for eliminating the effect of inversions within the testable delay selector. As shown in FIG. 10A, a multiplexer 1008 may be added to the 8:1 delay selector 702 (as discussed using FIG. 7). The signal to one of the inputs of the multiplexer 1008 may be the inverted output of the 8:1 delay selector 702 from an inverter 1004, and the signal to another one of the inputs of the multiplexer 1008 may be the buffered output of the 8:1 delay selector 702 from a buffer 1006. The multiplexer 1008 may be controlled via logic 1002 having inputs coupled to the control inputs of multiplexers of the delay selector 702. As shown in FIG. 10B, instead of using the inverter 1004 and the buffer 1006, an input of the multiplexer 1008 may be an inverting input. Similarly for the delay selector 702, instead of using inverters, an input of each of the multiplexers of the delay selector 702 may be an inverting input. Defects in the register 1010 or the outputs of the register 1010 may be untestable in the examples of FIGS. 10A and 10B.

Figure 11A:
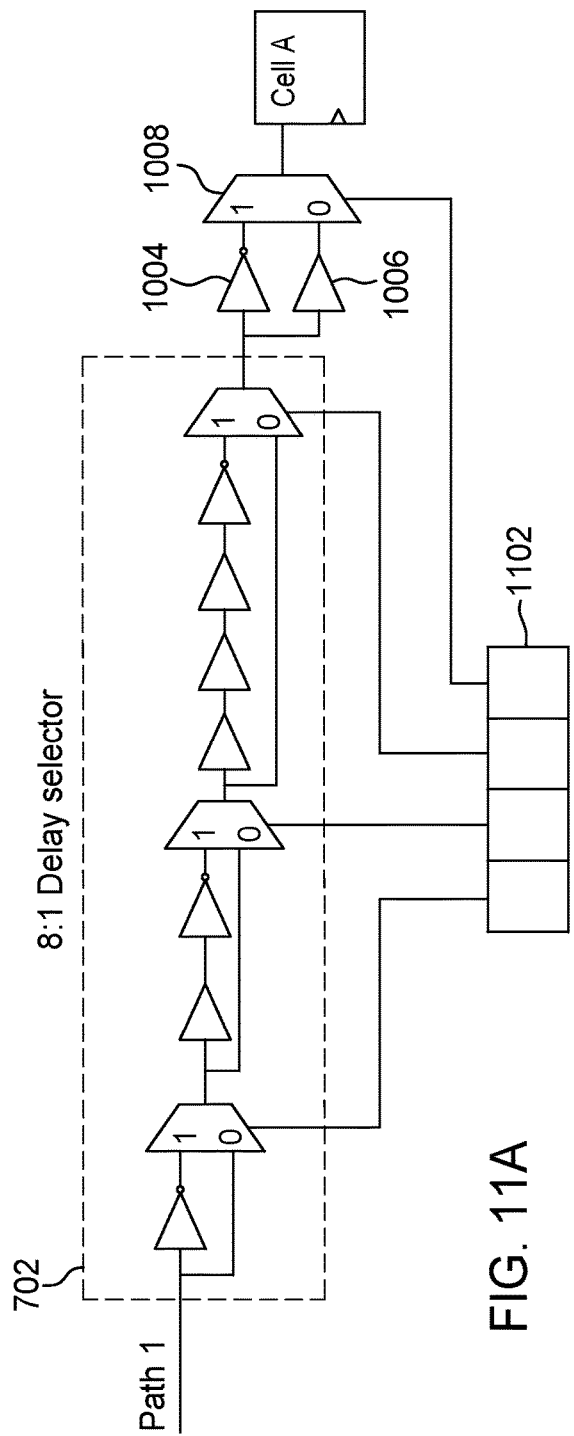
FIGS. 11A and 11B illustrate example techniques for eliminating effect of inversions within a testable delay selector.
Figure 11B:
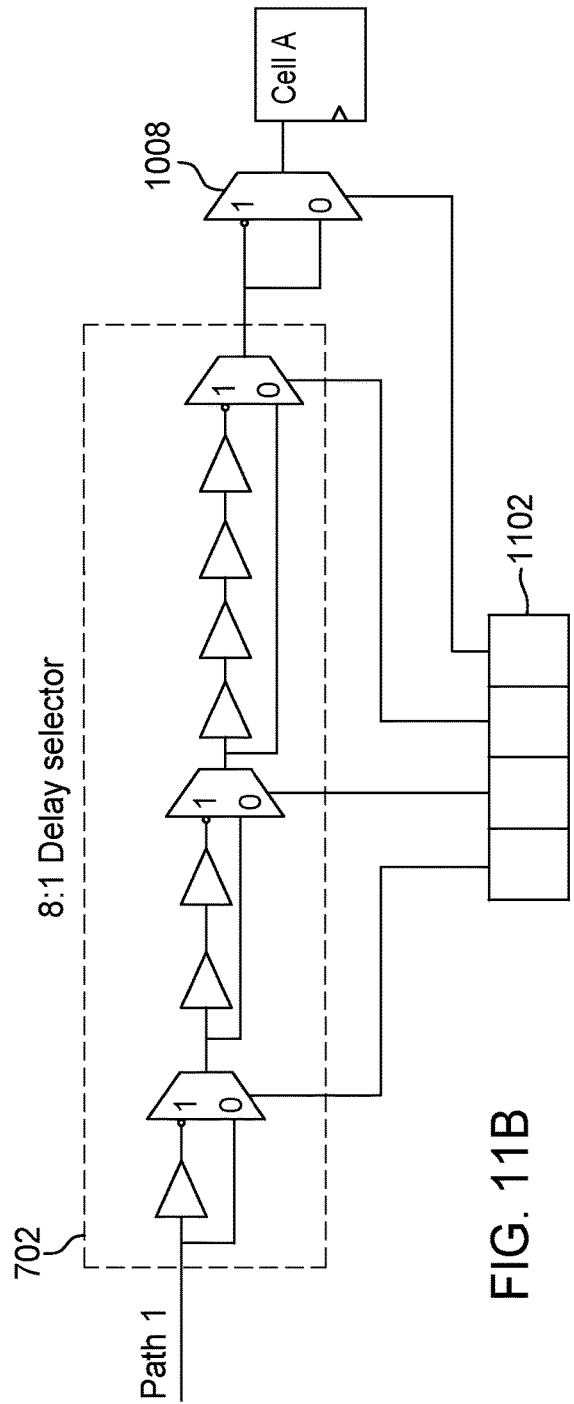

FIGS. 11A and 11B illustrate example techniques for eliminating the effect of inversions within the testable delay selector. As seen in FIGS. 11A and 11B, the control signal to the multiplexer 1008 is provided by adding an extra bit in the register 1102, where the value of the extra bit of the register 1102 may ensure that the register 1102 always outputs an even number of ones. If the control signals of all multiplexers contain an even number of ones, then the effect of inversions within the testable delay selector 702 may be eliminated. To ensure this condition, the extra bit of the register 1102, which is the control signal to the multiplexer 1008, is an XOR of the control signals to the multiplexers of the 8:1 delay selector 702. In other words, the extra bit in the register 1102 is a parity check bit of the control signals to the multiplexers of the 8:1 delay selector 702. As a result, the effect of inversions within the testable delay selector may be eliminated as well as defects in the register 1102 or the outputs of the register 1102 may be testable in the examples of FIGS. 11A and 11B.

Figure 12:
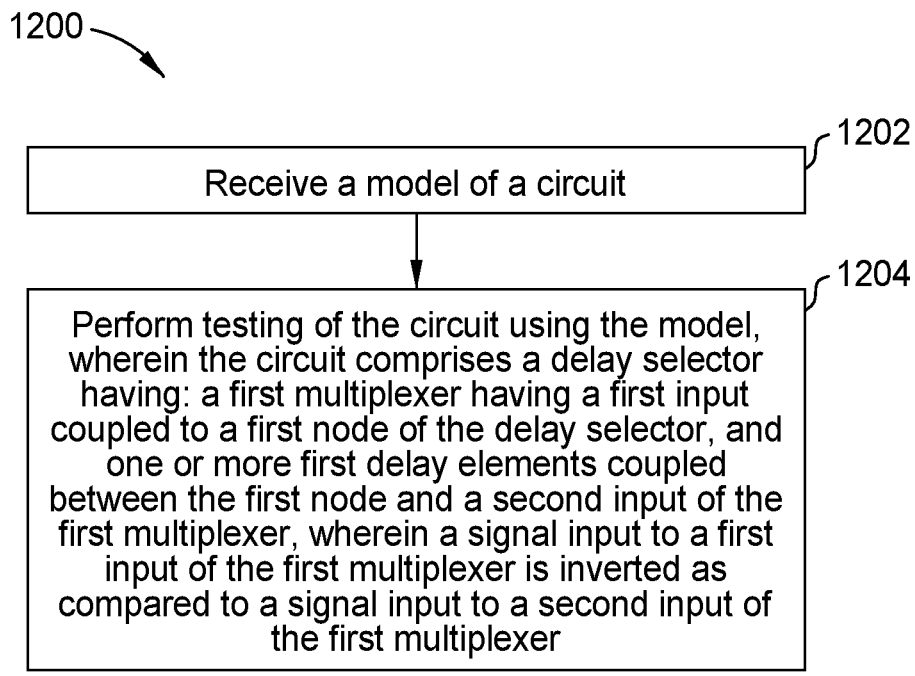
FIG. 12 is a flow diagram illustrating example operations for circuit testing.

FIG. 12 is a flow diagram illustrating an example operation 1200 for circuit testing, in accordance with certain aspects of the present disclosure. As described in further detail below, the operation 1200 may be embodied by one or more sets of instructions, which may be one or more software modules, stored on a non-transitory computer-readable medium. One or more processors of a computer system (e.g., the computer system 1500 of FIG. 15) can be configured to read and execute the one or more sets of instructions, which causes the one or more processors to perform the operation 1200. In some examples, some steps of the operation 1200 may be embodied as one or more sets of instructions as one or more software components, and other steps of the operation 1200 may be embodied as one or more other sets of instructions as one or more other software modules. The different software components can be distributed and stored on different non-transitory computer-readable media on different computer systems for execution by respective one or more processors of the different computer systems in some examples.

At 1202, the one or more processors receive a model (e.g., an ATPG model) of a circuit. At 1204, the one or more processors perform testing of the circuit using the model. The circuit may include a delay selector having a first multiplexer having a first input coupled to a first node of the delay selector, and one or more first delay elements coupled between the first node and a second input of the first multiplexer. In some aspects, an input signal to a first input of the first multiplexer is inverted as compared to an input signal to a second input of the first multiplexer. In some aspects of the present disclosure, one of the one or more first delay elements is an inverter. At least another one of the one or more first delay elements may be a buffer.

In some aspects, the delay selector may also include a second multiplexer having a first input coupled to a second node of the delay selector, an output of the second multiplexer being coupled to the first node, and one or more second delay elements coupled between the second node and a second input of the second multiplexer. One of the one or more second delay elements may be an inverter. In some aspects, a quantity of the one or more second delay elements is different than a quantity of the one or more first delay elements.

In some aspects, the circuit includes a time to digital converter (TDC) having the delay selector, the TDC further including a first flip flop having an input coupled to an output of the first multiplexer. The TDC may also include a second flip flop, and a delay element coupled between the output of the first multiplexer and an input of the second flip flop.

In certain embodiments, the delay selector includes a first multiplexer having a first input coupled to an input of the delay selector. The delay selector also includes a first inverter coupled between the input of the delay selector and a second input of the first multiplexer. The delay selector further includes a second multiplexer having a first input coupled to an output of the first multiplexer and a second inverter coupled between the output of the first multiplexer and a second input of the second multiplexer. The TDC includes the delay selector and a first flip flop having an input coupled to an output of the delay selector. In some embodiments, the TDC includes a third multiplexer arranged to receive an output of the delay selector at a first input of the third multiplexer and a first flip flop coupled to an output of the third multiplexer.

Figure 13:
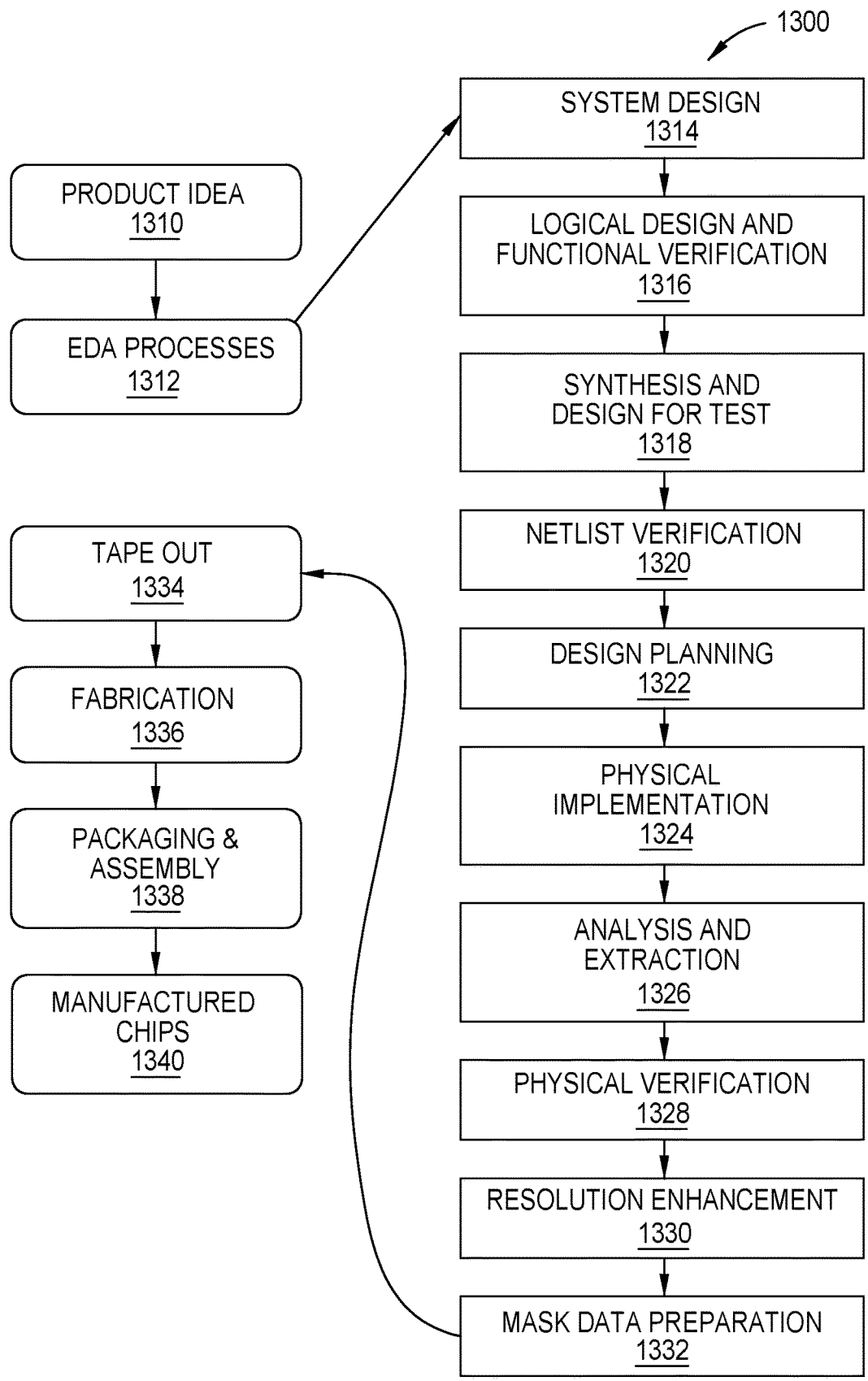
FIG. 13 depicts a flowchart of various processes used during the design and manufacture of an integrated circuit in accordance with some embodiments of the present disclosure.

FIG. 13 illustrates an example set of processes 1300 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1310 with information supplied by a designer, information which is transformed to create an article of manufacture that uses a set of EDA processes 1312. When the design is finalized, the design is taped-out 1334, which is when artwork (e.g., geometric patterns) for the integrated circuit is sent to a fabrication facility to manufacture the mask set, which is then used to manufacture the integrated circuit. After tape-out, a semiconductor die is fabricated 1336 and packaging and assembly processes 1338 are performed to produce the finished integrated circuit 1340.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 13. The processes described by be enabled by EDA products (or EDA systems).

During system design 1314, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1320, the netlist is checked for compliance with timing constraints and for correspondence with the HDL code. During design planning 1322, an overall floor plan for the integrated circuit is constructed and analyzed for timing and top-level routing.

During layout or physical implementation 1324, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1326, the circuit function is verified at the layout level, which permits refinement of the layout design. During physical verification 1328, the layout design is checked to ensure that manufacturing constraints are correct, such as DRC constraints, electrical constraints, lithographic constraints, and that circuitry function matches the HDL design specification. During resolution enhancement 1330, the geometry of the layout is transformed to improve how the circuit design is manufactured.

During tape-out, data is created to be used (after lithographic enhancements are applied if appropriate) for production of lithography masks. During mask data preparation 1332, the 'tape-out' data is used to produce lithography masks that are used to produce finished integrated circuits.

A storage subsystem of a computer system (such as computer system 1500 of FIG. 15, or host system 1407 of FIG. 14) may be used to store the programs and data structures that are used by some or all of the EDA products described herein, and products used for development of cells for the library and for physical and logical design that use the library.

Figure 14:
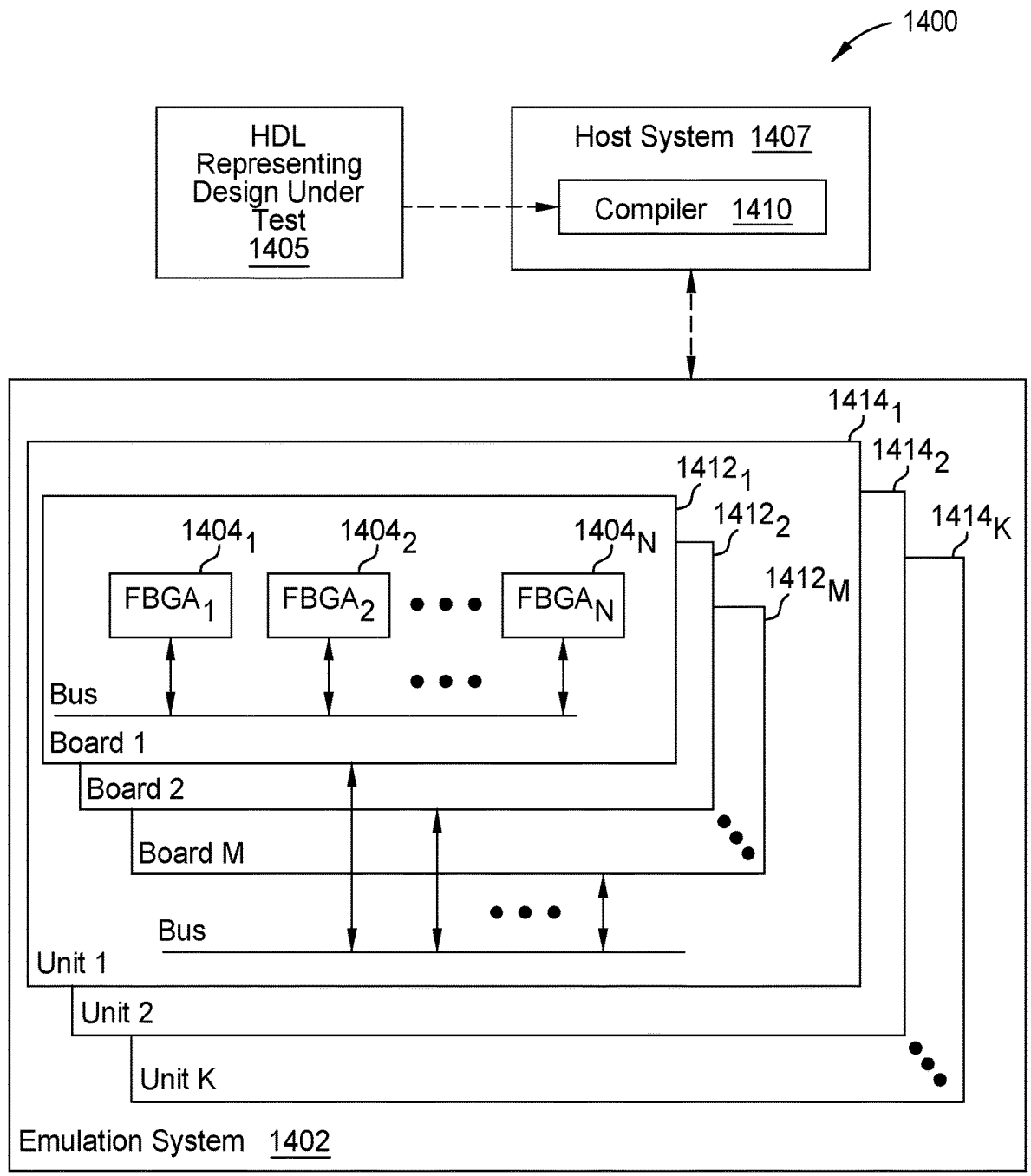
FIG. 14 depicts a diagram of an example emulation system in accordance with some embodiments of the present disclosure.

FIG. 14 depicts a diagram of an example emulation environment 1400. An emulation environment 1400 may be configured to verify the functionality of the circuit design. The emulation environment 1400 may include a host system 1407 (e.g., a computer that is part of an EDA system) and an emulation system 1402 (e.g., a set of programmable devices such as Field Programmable Gate Arrays (FPGAs) or processors). The host system generates data and information by using a compiler 1410 to structure the emulation system to emulate a circuit design. A circuit design to be emulated is also referred to as a Design Under Test ('DUT') where data and information from the emulation are used to verify the functionality of the DUT.

The host system 1407 may include one or more processors. In the embodiment where the host system includes multiple processors, the functions described herein as being performed by the host system can be distributed among the multiple processors. The host system 1407 may include a compiler 1410 to transform specifications written in a description language that represents a DUT and to produce data (e.g., binary data) and information that is used to structure the emulation system 1402 to emulate the DUT. The compiler 1410 can transform, change, restructure, add new functions to, and/or control the timing of the DUT.

The host system 1407 and emulation system 1402 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 1402.11. The host system 1407 and emulation system 1402 can exchange data and information through a third device such as a network server.

The emulation system 1402 includes multiple FPGAs (or other modules) such as FPGAs $1404_1$ and $1404_2$ as well as additional FPGAs to $1404_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 1402 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $1404_1$-$804_N$ may be placed onto one or more boards $1412_1$ and $1412_2$ as well as additional boards through $1412_M$. Multiple boards can be placed into an emulation unit $1414_1$. The boards within an emulation unit can be connected using the backplane of the emulation unit or any other types of connections. In addition, multiple emulation units (e.g., $1414_1$ and $1414_2$ through $1414_K$) can be connected to each other by cables or any other means to form a multi-emulation unit system.

For a DUT that is to be emulated, the host system 1407 transmits one or more bit files to the emulation system 1402. The bit files may specify a description of the DUT and may further specify partitions of the DUT created by the host system 1407 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1407 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 1407 and/or the compiler 1410 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 1405 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 15:
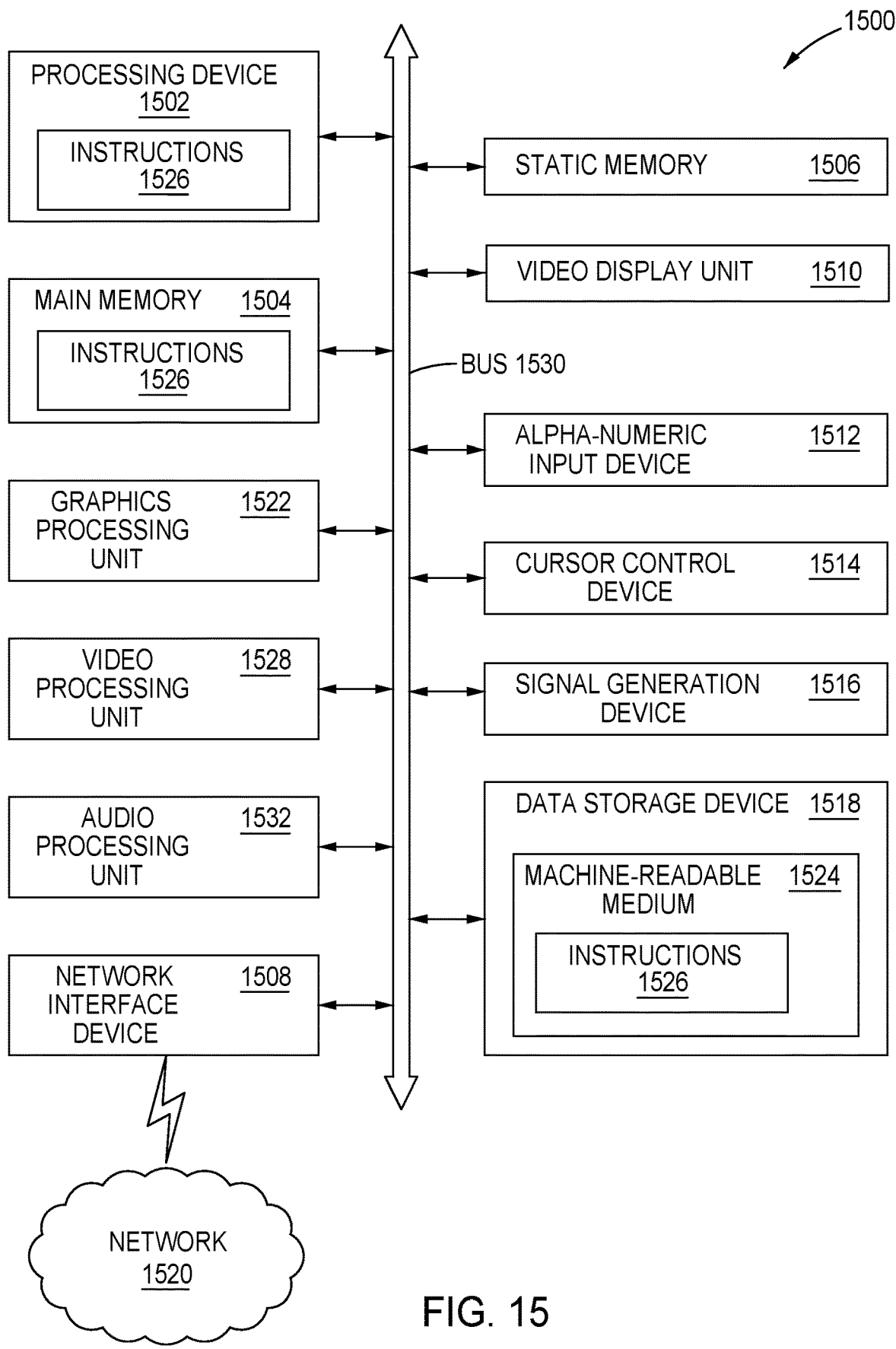
FIG. 15 depicts a diagram of an example computer system in which embodiments of the present disclosure may operate.

FIG. 15 illustrates an example machine of a computer system 1500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1500 includes a processing device 1502, a main memory 1504 (e.g., read-only memory (ROM), flash memory, dynamic random access memory (DRAM) such as synchronous DRAM (SDRAM), a static memory 1506 (e.g., flash memory, static random access memory (SRAM), etc.), and a data storage device 1518, which communicate with each other via a bus 1530.

Processing device 1502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1502 may also be one or more special-purpose processing devices such as an application specific integrated circuit (ASIC), a field programmable gate array (FPGA), a digital signal processor (DSP), network processor, or the like. The processing device 1502 may be configured to execute instructions 1526 for performing the operations and steps described herein.

The computer system 1500 may further include a network interface device 1508 to communicate over the network 1520. The computer system 1500 also may include a video display unit 1510 (e.g., a liquid crystal display (LCD) or a cathode ray tube (CRT)), an alphanumeric input device 1512 (e.g., a keyboard), a cursor control device 1514 (e.g., a mouse), a graphics processing unit 1522, a signal generation device 1516 (e.g., a speaker), graphics processing unit 1522, video processing unit 1528, and audio processing unit 1532.

The data storage device 1518 may include a machine-readable storage medium 1524 (also known as a non-transitory computer-readable medium) on which is stored one or more sets of instructions 1526 or software embodying any one or more of the methodologies or functions described herein. The instructions 1526 may also reside, completely or at least partially, within the main memory 1504 and/or within the processing device 1502 during execution thereof by the computer system 1500, the main memory 1504 and the processing device 1502 also constituting machine-readable storage media.

In some implementations, the instructions 1526 include instructions to implement functionality corresponding to the present disclosure. While the machine-readable storage medium 1524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A delay selector, comprising:
   a first multiplexer having a first input coupled to an input of the delay selector;
   a first inverter coupled between the input of the delay selector and a second input of the first multiplexer;
   a second multiplexer having a first input coupled to an output of the first multiplexer; and
   a second inverter coupled between the output of the first multiplexer and a second input of the second multiplexer.

2. The delay selector of claim 1, further comprising a buffer coupled between the output of the first multiplexer and the second input of the second multiplexer in series with the second inverter.

3. The delay selector of claim 1, further comprising:
   a third multiplexer having a first input coupled to an output of the second multiplexer;
   a third inverter coupled between the output of the second multiplexer and a second input of the third multiplexer; and
   one or more buffers coupled between the output of the second multiplexer and the second input of the third multiplexer in series with the third inverter.

4. The delay selector of claim 3, wherein more buffers are coupled in series with the third inverter between the output of the second multiplexer and the second input of the third multiplexer than in series with the second inverter between the output of the first multiplexer and the second input of the second multiplexer.

5. The delay selector of claim 1, further comprising a buffer coupled between an output of the second multiplexer and a first output of the delay selector, wherein the output of the second multiplexer is coupled to a second output of the delay selector.

6. A time-to-digital converter (TDC) comprising:
   a delay selector comprising:
      a first multiplexer having a first input coupled to an input of the delay selector;
      a first inverter coupled between the input of the delay selector and a second input of the first multiplexer;
      a second multiplexer having a first input coupled to an output of the first multiplexer; and
      a second inverter coupled between the output of the first multiplexer and a second input of the second multiplexer; and
   a first flip flop having an input coupled to an output of the delay selector.

7. The TDC of claim 6, further comprising:
   a second flip flop; and
   a buffer coupled between the output of the second multiplexer and an input of the second flip flop.

8. The TDC of claim 6, further comprising:
   a third multiplexer having a first input coupled to an output of the second multiplexer;

a third inverter coupled between the output of the second multiplexer and a second input of the third multiplexer; and one or more buffers coupled between the output of the second multiplexer and the second input of the third multiplexer in series with the third inverter.

9. The TDC of claim 8, wherein more buffers are coupled in series with the third inverter between the output of the second multiplexer and the second input of the third multiplexer than in series with the second inverter between the output of the first multiplexer and the second input of the second multiplexer.

10. The TDC of claim 8, further comprising a register arranged to provide control signals to the first multiplexer and the second multiplexer.

11. The TDC of claim 10, wherein the control signals adjust a delay provided by the delay selector.

12. A TDC comprising:
 a delay selector comprising:
   a first multiplexer having a first input coupled to an input of the delay selector;
   a first inverter coupled between the input of the delay selector and a second input of the first multiplexer;
   a second multiplexer having a first input coupled to an output of the first multiplexer; and
   a second inverter coupled between the output of the first multiplexer and a second input of the second multiplexer;
 a third multiplexer arranged to receive an output of the delay selector at a first input of the third multiplexer; and
 a first flip flop coupled to an output of the third multiplexer.

13. The TDC of claim 12, further comprising:
 a third inverter coupled between the output of the delay selector and a second input of the third multiplexer; and
 a buffer coupled between the output of the delay selector and the first input of the third multiplexer.

14. The TDC of claim 12, wherein a second input of the third multiplexer is an inverting input and is coupled to the output of the delay selector.

15. The TDC of claim 14 wherein:
 the second input of the first multiplexer is an inverting input comprising the first inverter; and
 the second input of the second multiplexer is an inverting input comprising the second inverter.

16. The TDC of claim 12, further comprising a register arranged to provide control signals to the first multiplexer and the second multiplexer.

17. The TDC of claim 16, wherein the control signals adjust a delay provided by the delay selector.

18. The TDC of claim 16, further comprising logic arranged to produce, to the third multiplexer, a control signal based on the control signals provided by the register.

19. The TDC of claim 18, wherein the control signal produced by the logic is an exclusive or of the control signals provided by the register.

20. The TDC of claim 16, wherein the register is further arranged to produce a control signal to the third multiplexer.

* * * * *